（12） United States Patent
Thompson

(10) Patent No.: US 12,506,304 B2
(45) Date of Patent: Dec. 23, 2025

(54) CAPACITOR IN SOCKET

(71) Applicant: R&D Circuits, San Jose, CA (US)

(72) Inventor: Donald Eric Thompson, Fremont, CA (US)

(73) Assignee: R&D Circuits, San Jose, CA (US)

( * ) Notice: Subject to any disclaimer, the term of this patent is extended or adjusted under 35 U.S.C. 154(b) by 403 days.

(21) Appl. No.: 18/109,199

(22) Filed: Feb. 13, 2023

(65) Prior Publication Data

US 2023/0198209 A1 Jun. 22, 2023

Related U.S. Application Data

(62) Division of application No. 16/887,640, filed on May 29, 2020, now abandoned.

(51) Int. Cl.
| | | |
|---|---|---|
| *G01R 1/073* | (2006.01) | |
| *G01R 1/04* | (2006.01) | |
| *H01R 13/17* | (2006.01) | |
| *H01R 13/66* | (2006.01) | |

(52) U.S. Cl.
CPC ....... *H01R 13/6625* (2013.01); *G01R 1/0483* (2013.01); *G01R 1/07342* (2013.01); *H01R 13/17* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| | | | |
|---|---|---|---|
| 7,129,728 B2 | 10/2006 | Kinoshita | |
| 7,663,387 B2 | 2/2010 | Yoshida et al. | |
| 2002/0195700 A1* | 12/2002 | Li | H01J 9/326 |
| | | | 438/622 |
| 2003/0111709 A1* | 6/2003 | Lin | H01L 23/50 |
| | | | 257/E23.079 |

* cited by examiner

*Primary Examiner* — Tung X Nguyen
(74) *Attorney, Agent, or Firm* — Artegis Law Group, LLP

(57) ABSTRACT

An improved method and structure for forming an electrical interconnects mechanism in a Power Distribution Network (PDN) by placing capacitors on the top of the pin array on the printed circuit board (PCB) of the structure to decouple the PDN and results in lower impedance benefitting the frequency range of the PDN effecting a significant performance improvement in the spring-pin inductance from the transmission line. This reduction in impedance reduces the power supply ripple.

20 Claims, 13 Drawing Sheets

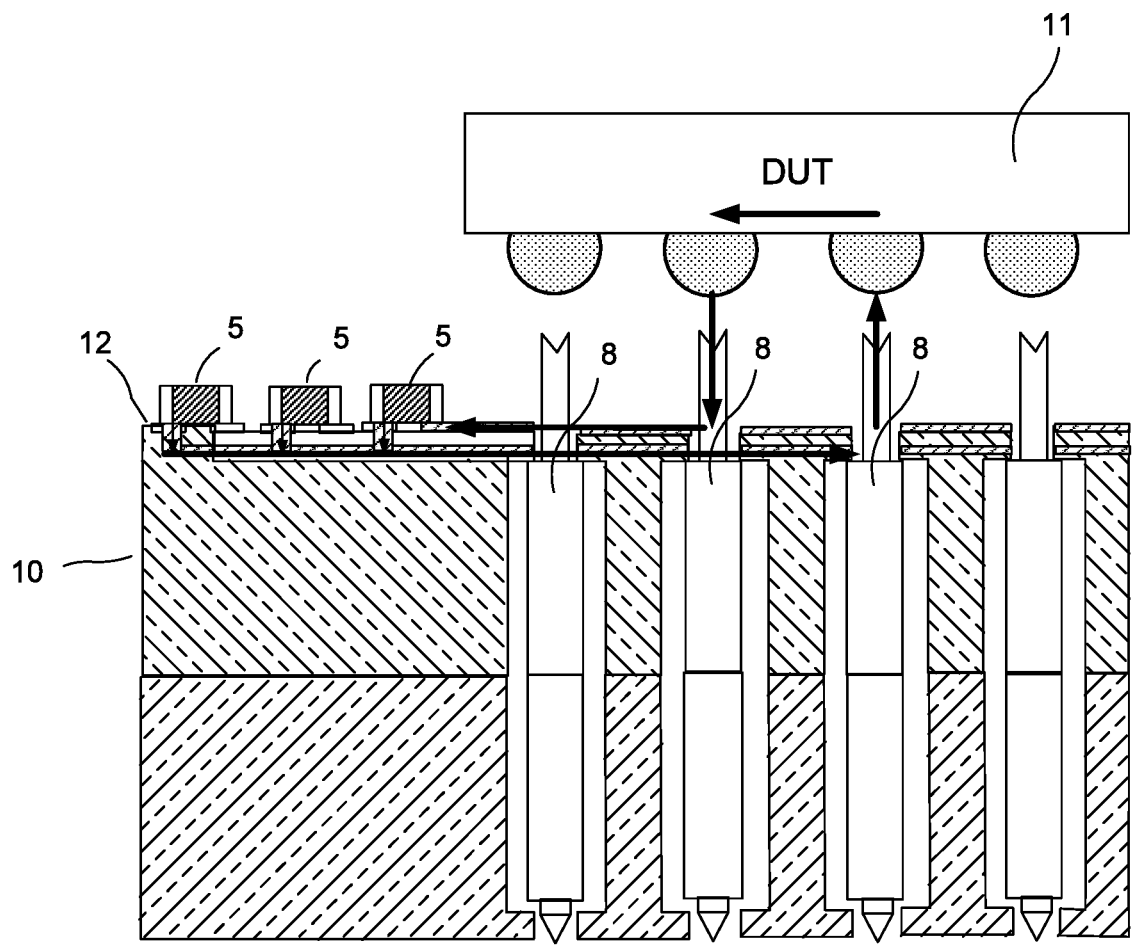
F I G. 2

| | 10MHz | 20MHz | 30MHz | 40MHz | 50MHz | 60MHz | 70MHz | 80MHz | 90MHz | 100MHz |
|---|---|---|---|---|---|---|---|---|---|---|
| Impedance: Cap on bottom only | 24mΩ | 48mΩ | 70mΩ | 92mΩ | 110mΩ | 131mΩ | 152mΩ | 171mΩ | 195mΩ | 214mΩ |
| Impedance: Cap on top only | 8mΩ | 17mΩ | 25mΩ | 32mΩ | 40mΩ | 48mΩ | 55mΩ | 62mΩ | 70mΩ | 76mΩ |
| Ripple reduction | 65% | 64% | 64% | 65% | 63% | 64% | 64% | 64% | 64% | 64% |

F I G. 4C

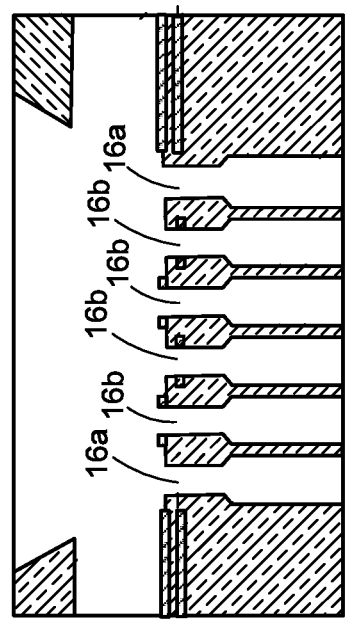
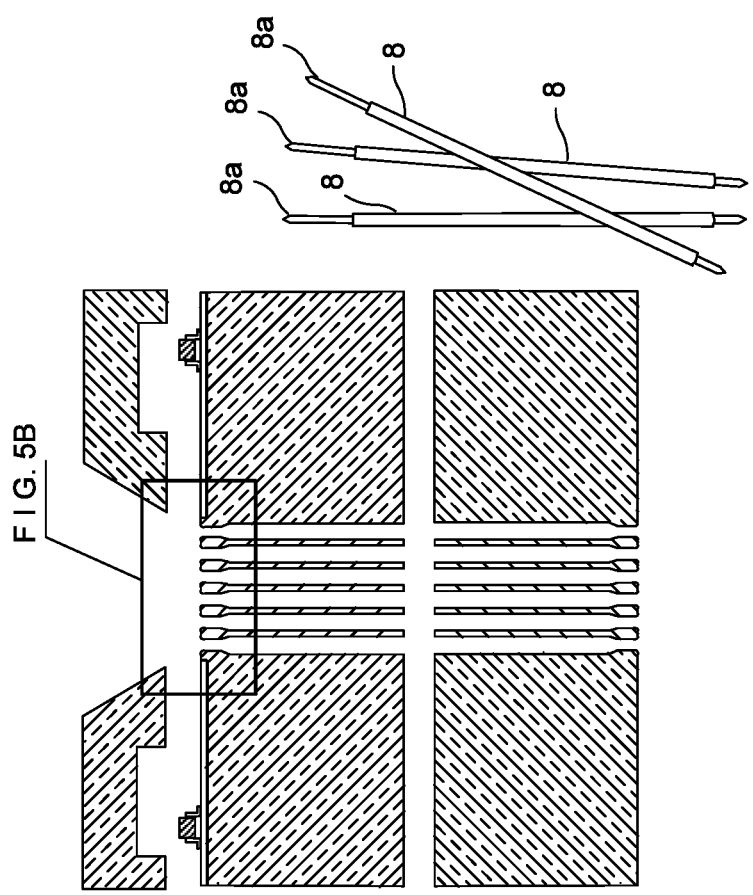
FIG. 5B
FIG. 5A

Cost Effective Socket with Caps

1. PCB Dielectric with an etched power ground planes at top of socket (4 layers brd)

2. Drill stepped hole

3. Plate "Via"

4. Etch or drill away copper on PWR

5. Route in power plane outside of DUT array and add capacitors

6. Add pins

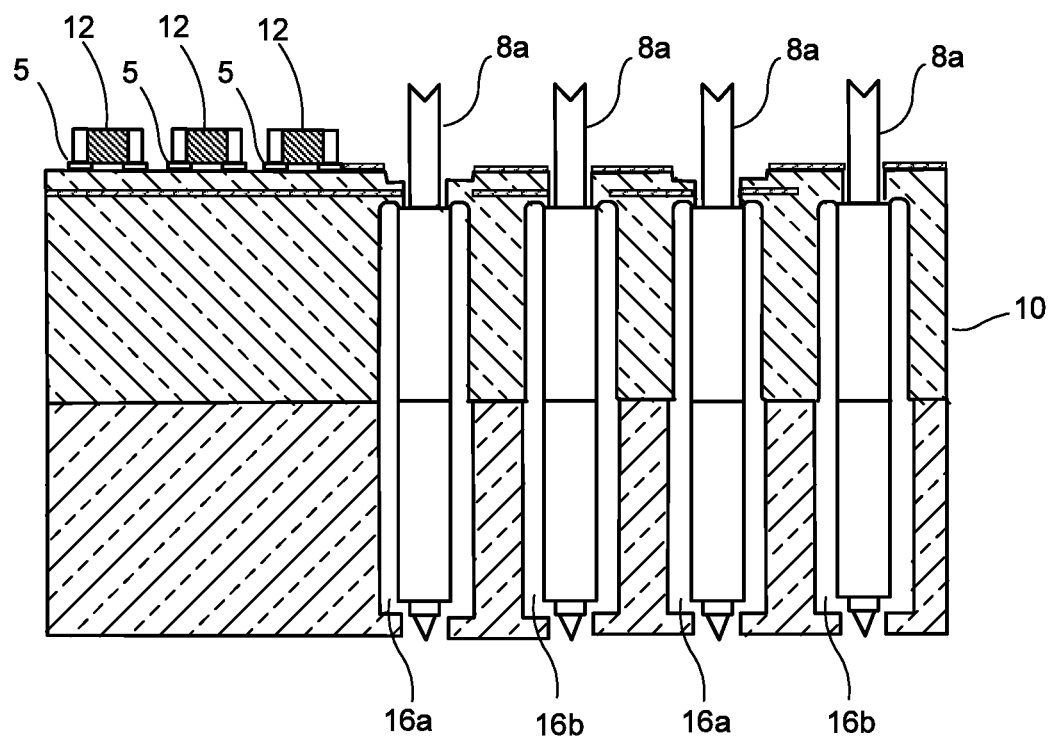
F I G. 6G

| Pitch | Pitch | Plunger Hole | Barrel Hole | Keep-out dia | Copper Web |
|---|---|---|---|---|---|
| 0.35 mm | 13.8 mils | 5.9 mils | 9.1 mils | 11.9 mils | 1.9 mils |
| 0.40 mm | 15.7 mils | 7.9 mils | 13.0 mils | 13.9 mils | 1.8 mils |
| 0.50 mm | 19.7 mils | 10.6 mils | 16.1 mils | 17.6 mils | 2.1 mils |
| 0.65 mm | 25.6 mils | 10.6 mils | 16.1 mils | 19.6 mils | 6.0 mils |
| 0.80 mm | 31.5 mils | 13.8 mils | 24.0 mils | 22.8 mils | 8.7 mils |
| 1.00 mm | 39.4 mils | 21.7 mils | 33.1 mils | 30.7 mils | 8.7 mils |

Unplated hole

| Plunger drill | Plunger hole after plating | Barrel hole |
|---|---|---|
| 6.9 mils | 5.9 mils | 9.1 mils |
| 8.9 mils | 7.9 mils | 13.0 mils |
| 11.6 mils | 10.6 mils | 16.1 mils |
| 11.6 mils | 10.6 mils | 16.1 mils |
| 14.8 mils | 13.8 mils | 24.0 mils |
| 22.7 mils | 21.7 mils | 33.1 mils |

Plated hole

F I G. 9A

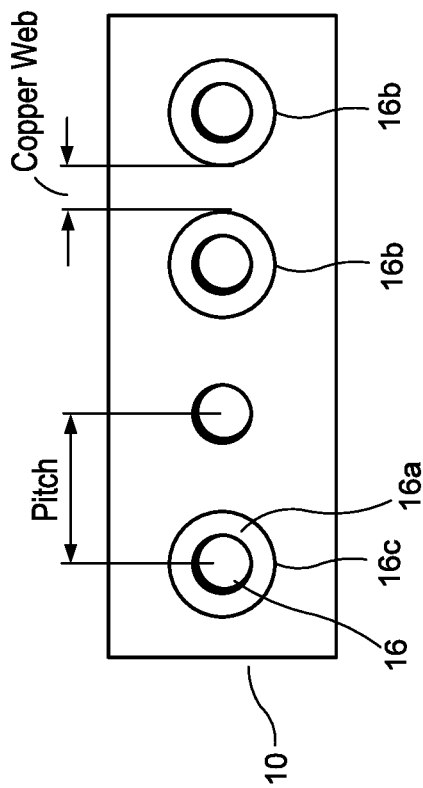

F I G. 9B

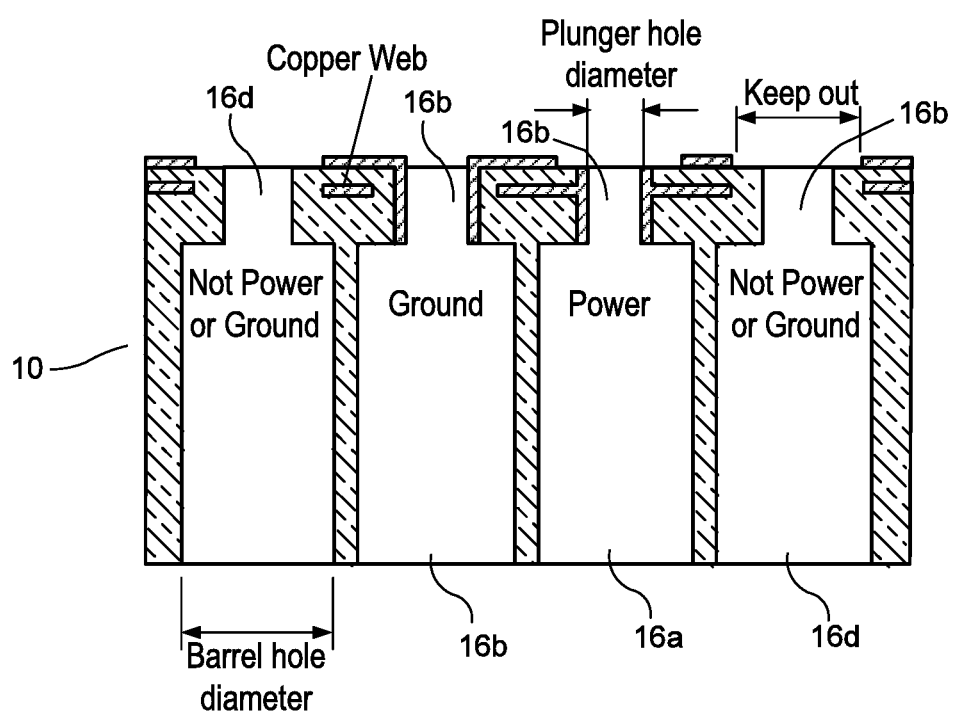
F I G. 9C

CAPACITOR IN SOCKET

RELATED APPLICATION(S)

The present Application is a Divisional Application of, and claims benefit of, co-pending, commonly owned U.S. patent application Ser. No. 16/887,640, filed May 29, 2020, entitled "Capacitor in Socket," to Thompson, which is hereby incorporated herein by reference in its entirety.

FIELD OF INVENTION

The present invention relates to an improved method and structure for forming an electrical interconnect mechanism in a Power Distribution Network (PDN) in which the present invention maintains stable power supplies at their target voltage across an entire usage range of a device under test (DUT) or circuit. The PDN is an entire network between the power supply and the DUT. In particular, the present invention provides and places capacitors on the printed circuit board (PCB) of the structure to decouple the PDN and result in lower impedance benefitting the frequency range of the PDN to effect a significant performance improvement in the spring-pin inductance from the transmission line. This reduction in impedance results in a reduction of the power supply ripple.

BACKGROUND

U.S. Pat. No. 6,597,190 to Chan et al. relates to an apparatus for testing electronic devices. Chan et al requires that the spring-pin has a shoulder and that it sits on top of the board to make a connection. In addition, the Chan et al. patent discloses in its drawings that the power and ground planes are located in the wider part of the pin area.

In addition, the Chan et al. patent shows the board (element 320) on the bottom of the socket. In Chan et al., the capacitors are placed and located on the bottom which significantly reduces the benefit from having capacitors on the socket at all. Other elements in the Chan patent include a plurality of pins 155, the contactor housing 310, the power plane 360 and the ground plane 370 and, the test contactor 305. There is little to no advantage from just placing the capacitors on the board into which the socket is plugged.

SUMMARY OF THE INVENTION

The present invention provides for an improved method and structure for forming an electrical interconnects mechanism in a Power Distribution Network (PDN). The present invention provides and places capacitors on the printed circuit board (PCB) of the structure to decouple the PDN and result in lower impedance benefitting the frequency range of the PDN to effect a significant performance improvement in the spring-pin inductance from the transmission line. This reduction in impedance results in a reduction of the power supply ripple. This is accomplished by placing the capacitors on the top of the pin array. The reduced loop inductance of having the capacitor on the top side provides for a much better result than having the capacitors on the bottom of the pin as noted in the aforementioned prior art proposal. By placing the capacitors on the bottom, the inductance of the spring-pins are added to the inductances. This significantly negates or arguably removes the benefit and cost of putting these capacitors on the socket.

In accordance with embodiments of the present invention, a socket structure includes a first surface including a first area configured to receive and to couple to a device and a second area including a plurality of capacitors. The first area and the second area do not overlap. The socket structure also includes a ground plane and a power plane disposed parallel to the first surface and coupled to the capacitors.

Embodiments include the above and further include wherein the first area includes a plurality of plated through holes.

Embodiments include the above and further include wherein the first area further includes a plurality of spring pins positioned in a respective one of the plurality of plated through holes.

Embodiments include the above and further include wherein each of the plurality of plated through holes includes a first portion adjacent the first surface and a second portion including a width greater than a width of the first portion.

Embodiments include the above and further include wherein each of the plurality of spring pins includes a body including a first end and a second end and a plunger portion that protrudes from the first end and includes a smaller width than a body width of the body.

Embodiments include the above and further include wherein a first set of the plated through holes is coupled to the ground plane, and wherein a second set of the plated through holes is coupled to the power plane, wherein the body contacts a respective plated through hole, and wherein the plunger portion extends through a respective first portion of the respective plated through hole and extends through the first surface without contacting the respective plated through hole.

Embodiments include the above and further include wherein the plurality of capacitors are configured to reduce a ripple of a power supply.

In accordance with other embodiments of the present invention, a socket structure includes a first surface including a first area and a second area including a plurality of capacitors. The first area and the second area do not overlap. The socket structure also includes a ground plane and a power plane disposed parallel to the first surface and coupled to the capacitors. The first area includes a plurality of plated through holes and a plurality of spring pins positioned in a respective one of the plurality of plated through holes.

Embodiments include the above and further include wherein each of the plurality of plated through holes includes a first portion adjacent the first surface and a second portion including a width greater than a width of the first portion.

Embodiments include the above and further include wherein each of the plurality of spring pins includes a body including a first end and a second end and a plunger portion that protrudes from the first end and includes a smaller width than a body width of the body.

Embodiments include the above and further include wherein a first set of the plated through holes is coupled to the ground plane, and wherein a second set of the plated through holes is coupled to the power plane, wherein the body contacts a respective plated through hole, and wherein the plunger portion extends through a respective first portion of the respective plated through hole and extends through the first surface without contacting the respective plated through hole.

Embodiments include the above and further include wherein the plurality of capacitors are configured to reduce a ripple of a power supply.

Embodiments include the above and further include wherein the first area is configured to receive and to couple to a device.

Embodiments include the above and further include wherein the device includes a pitch property of one of 0.35 mm or 0.4 mm.

In accordance with further embodiments of the present invention, a socket structure includes a top surface, an opposite surface located opposite the top surface, a ground plane and a power plane disposed parallel to the top surface, and a plurality of plated through holes extending between the top surface and the opposite surface. Each of the plurality of plated through holes includes a first portion adjacent the top surface and a second portion including a width greater than a width of the first portion. A first set of the plated through holes is coupled to the ground plane, and a second set of the plated through holes is coupled to the power plane, and a plurality of spring pins positioned in a respective one of the plurality of plated through holes. Each of the plurality of spring pins includes a body including a first end and a second end and a plunger portion that protrudes from the first end and includes a smaller width than a body width of the body. The body contacts a respective plated through hole, and the plunger portion extends through a respective first portion of the respective plated through hole and extends through the top surface without contacting the respective plated through hole.

Embodiments include the above and further include a printed circuit board including the top surface, the ground plane, and the power plane.

Embodiments include the above and further include wherein the top surface includes a first area including the plurality of plated through holes and a second area including a plurality of capacitors, wherein the first area and the second area do not overlap.

Embodiments include the above and further include wherein the plurality of capacitors are configured to reduce a ripple of a power supply.

Embodiments include the above and further include wherein the first area is configured to receive and to couple to a device.

Embodiments include the above and further include wherein the device includes a pitch property of one of 0.35 mm or 0.4 mm.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

FIG. 2 illustrates a loop inductance in which capacitors are placed on top of a pin array, in accordance with the present invention.

FIG. 4C is a chart showing the values plotted for the graph in FIG. 4B, in accordance with embodiments of the present invention.

FIG. 5A shows a prior art proposal for power and ground planes in a socket.

FIG. 5B shows an embodiment of the present invention in which room is provided to build power and ground planes in a fat or wide portion of the hole for the tolerance to work;

FIG. 6G shows an assembled structure, in accordance with embodiments of the present invention.

FIG. 9A is a chart of values for different sized vias having a fat or wide portion of the holes to accommodate or house power and ground planes within a range of tolerances for pitch sockets in the fat or wide portion of the holes, in accordance with embodiments of the present invention FIG. 9B shows a top view where a plunger drill widens a drilled via for placement in the wider portion of power or ground planes in the vias and to house pitch sockets of various sizes as described but not limited to the sizes shown in FIG. 9A, in accordance with embodiments of the present invention.

FIG. 9C shows a side view where a plunger drill widens a drilled or barrel drilled via for placement in the wider portion of power or ground planes in the plated and non plated holes, respectively and to house pitch sockets of various sizes, in accordance with embodiments of the present invention.

DETAILED DESCRIPTION

Figure 1A:
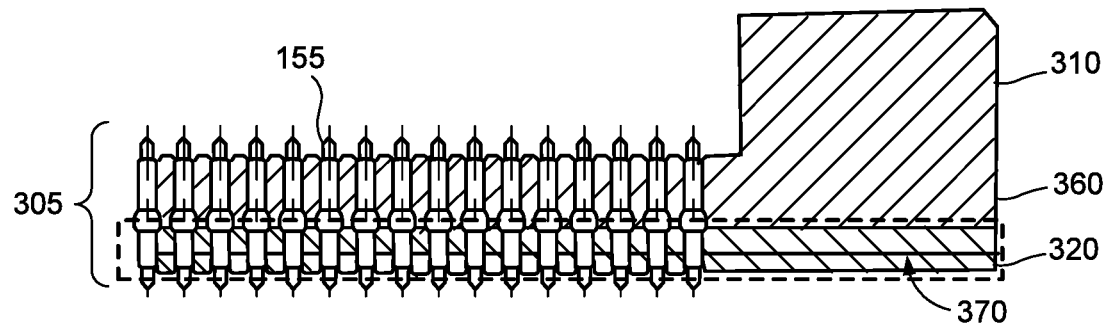
FIG. 1A is a prior art illustration of the location of capacitors on the bottom of a printed circuit board (PCB).

Referring now to the drawings, FIG. 1A is a prior art illustration of the location of capacitors on the bottom of a printed circuit board (PCB) as shown in U.S. Pat. No. 6,597,190 to Chan et al. The Chan et al. patent shows the PCB (element 320) on the bottom of the socket. In Chan et al., the capacitors are placed and located on the bottom which significantly reduces the benefit from having capacitors on the socket at all. There is little to no advantage from just placing the capacitors on the board for plugging into the socket.

Figure 1B:
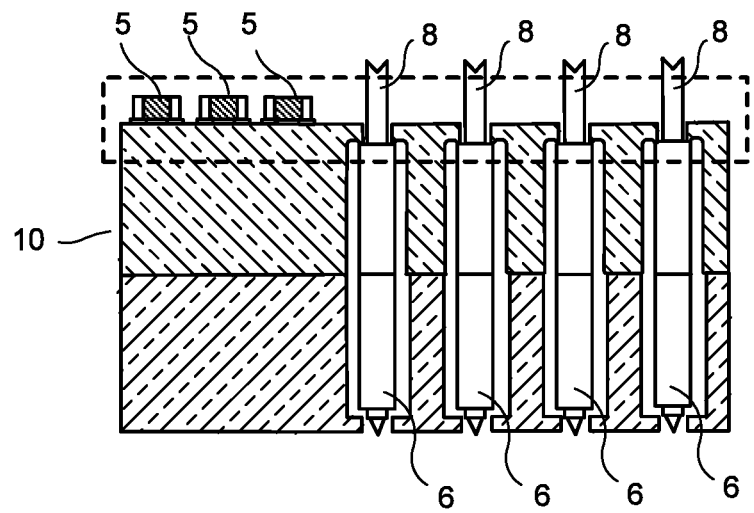
FIG. 1B illustrates capacitors are placed on top of a pin array on a printed circuit board (PCB) in accordance with the teachings of the present invention.

FIG. 1B illustrates a portion of the structure and methodology of the present invention in which capacitors 5 are placed on top of a pin array 8 on a printed circuit board 10 (PCB) in accordance with the teachings of the present invention. The purpose of having capacitors in the socket is to reduce the inductance between the capacitors and the device under test 11 (DUT) (FIG. 2) which is connected or placed on top of the PCB. By placing the capacitors on the bottom, as taught by the conventional art, the benefit derived from having capacitors on the socket is significantly reduced and the capacitors might just as well be put into the board in which the socket is plugged.

FIG. 2 illustrates a loop inductance in which capacitors are placed on top of the pin array as shown in FIG. 1B. In FIG. 2, the loop inductance provides a much better result with the present invention's solution of placing capacitors 5 on top than by having the capacitors 5 on the bottom of the pin array 8. By placing the capacitors 5 on the bottom, as taught in the aforementioned prior art reference, means that the inductance of the spring-pin 8 is added to the loop inductance significantly negating and possibly removing the benefit and cost of putting the capacitors 5 on the socket 12.

Figure 4A:
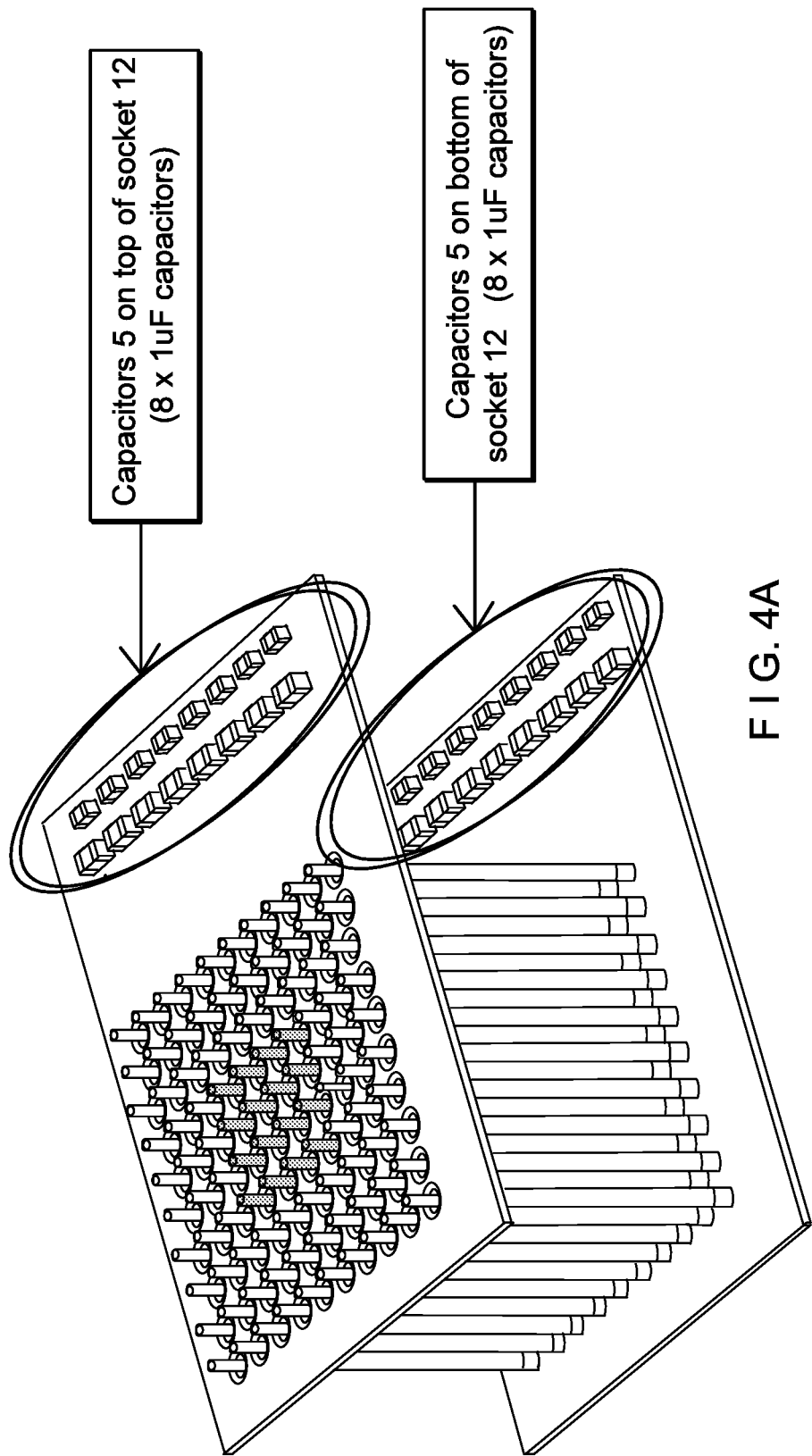
FIG. 4A illustrates both the configuration of the present invention in which capacitors are located on top of a socket of a printed circuit board (PCB), in accordance with embodiments of the present invention.
Figure 4B:
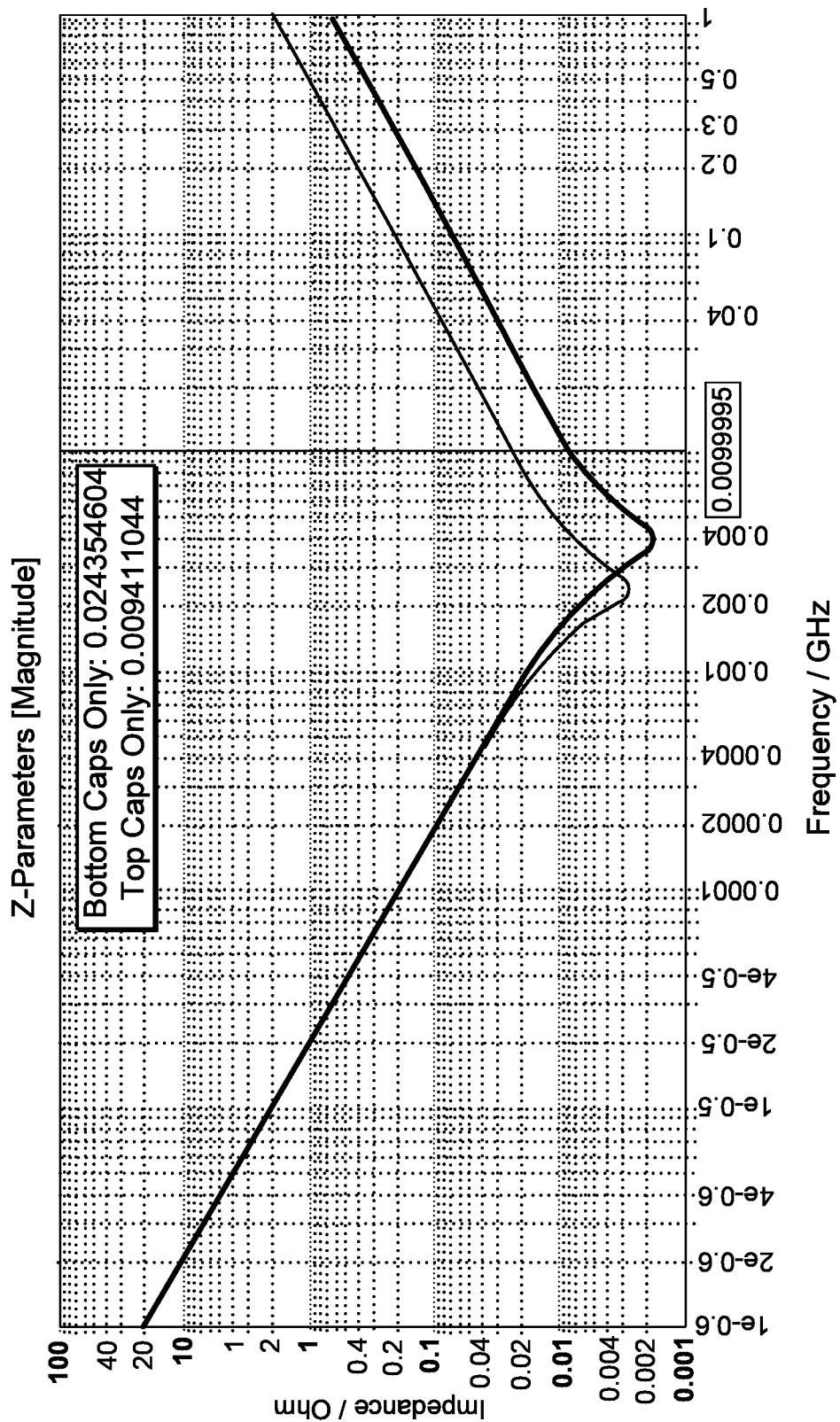
FIG. 4B is a graph illustrating impedance and frequency for capacitors placed on top of a socket of a printed circuit board (PCB, in accordance with embodiments of the present invention.

FIG. 4A illustrates both the configuration of the present invention in which capacitors are located on top of a socket 12 of a printed circuit board 10 (PCB) and also the prior art proposal in which capacitors are on the bottom of a socket of a printed circuit board (PCB). The advantages can be seen in FIGS. 4B and 4C. FIG. 4B is a graph illustrating impedance and frequency for capacitors placed on top of a socket of a printed circuit board (PCB) as shown in FIG. 4A. FIG. 4C is a chart showing the values plotted for the graph in FIG. 4B and the reduction in power supply ripple when the capacitors are placed on top of the socket.

As can be seen from FIGS. 4B and 4C, the present invention provides better lower impedance and by adding capacitance 5 in the socket 12 and shows PDN benefits in the intended frequency range of approximately 5 MHz to 500 MHz. This improvement is affected by changing the location of the capacitors to be placed on top of a socket 12 of a printed circuit board 10 (PCB) resulting in improved performance in the critical frequency range of approximately 5 MHz to 500 MHz. In the approximate range of 5 MHz to 500 MHZ, there is a significant improvement since the present invention structure and methodology eliminates a majority of spring pin inductance from the transmission line. From a practical standpoint, this reduction in impedance results in a reduction of power supply ripple as shown in FIG. 4C. FIG. 4C shows a constant improvement of 65% in the aforementioned target frequency range. A 65% improvement means that a 100 mV ripple on a power line supply would become 35 mV by changing the location of the capacitors from the bottom to the top of the socket.

Figure 3B:
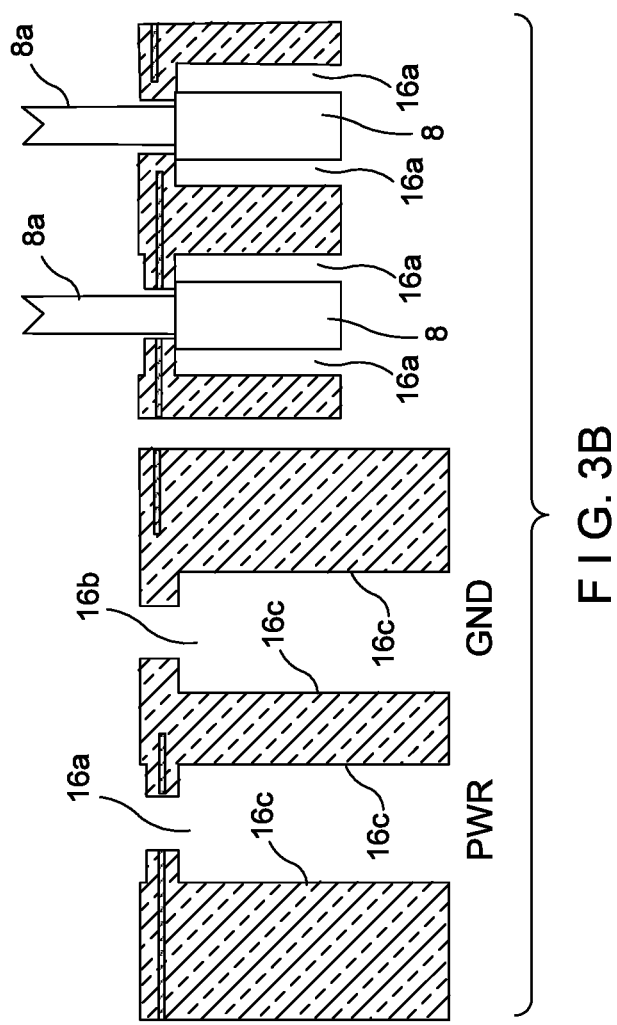
FIG. 3B shows a plated inner hole for a pin that touches or makes contact with the plating as it is held in place through the use of a top narrow plunger-like electrical connection permitting the use for fine pitch solutions sockets, in accordance with the teachings of the present invention.
Figure 3A:
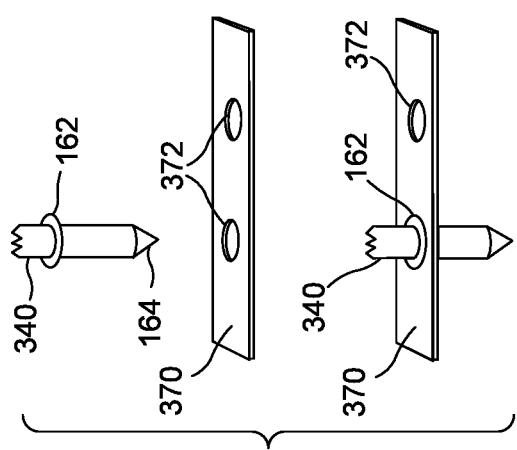
FIG. 3A is a prior art illustration referencing a prior art illustration in FIG. 1 of the Chan patent in which a spring pin has a shoulder that rests or is seated on top of a printed circuit board (PCB).

FIG. 3A is a prior art illustration described in the aforementioned Chan patent in which a spring pin 340 has a shoulder (see FIG. 1 of prior art illustration in Chan patent, element 160) that rests or is seated on top of a printed circuit board 370 (PCB). Other elements in the Chan patent description include ground pin 340, lip 162 of the ground pin 340 and the beveled tip 164, aperture 372, and ground plane 370. FIG. 3B shows an alternative to the prior art approach of FIG. 3A in which a plated inner hole 16a for a pin 8 that touches or makes contact with the plating 16a as it is held in place permitting a use of a top narrow plunger-like electrical connection 8a. The top narrow plunger 8a allows fine pitch solutions of approximately 0.4 mm and 0.35 mm pitch sockets in accordance with the teachings of the present invention. The shoulder that rests or is seated on top of a printed circuit board, see shoulder element 160 of FIG. 1 of the Chan patent showing a prior art proposal, requires greater mechanical space and is unsuitable for 0.4 mm and 0.35 mm sockets.

FIGS. 5A and 5B compare the prior art and the present invention, respectively, for power and ground planes 18 in a socket for a 0.35 mm pitch. FIG. 5B is an embodiment of the present invention where room is provided to build power and ground planes in a fat or wide portion of the plated hole 16a and the non plated hole 16b, respectively for the tolerance to work.

Figure 6A:
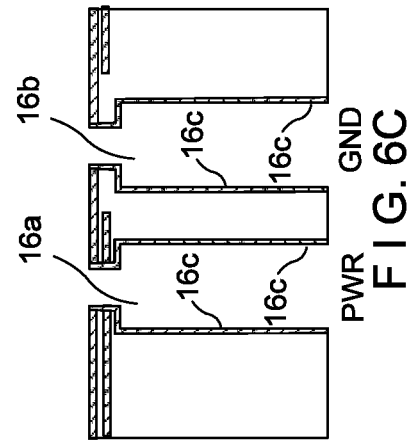
FIG. 6A shows etching power ground planes at atop of a socket, in accordance with embodiments of the present invention
Figure 6B:
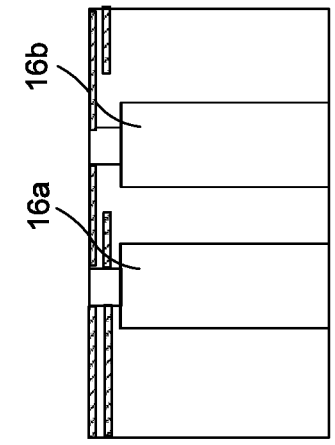
FIG. 6B shows a drill stepped hole, in accordance with embodiments of the present invention.
Figure 6C:
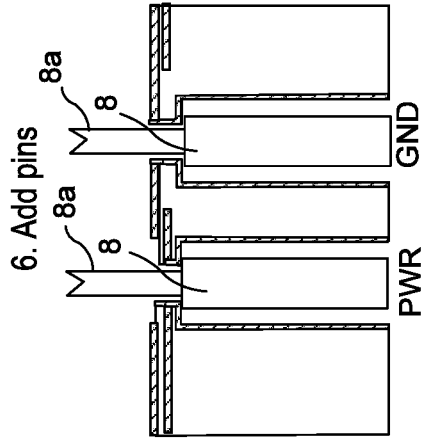
FIG. 6C shows a plate via, in accordance with embodiments of the present invention.
Figure 6D:
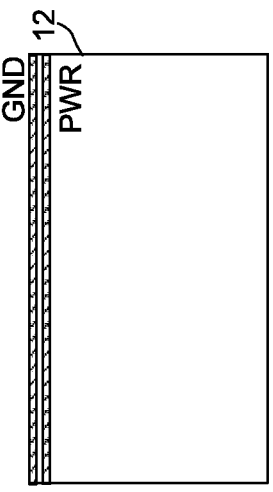
FIG. 6D shows a step of removing top copper on the power ground plane, in accordance with embodiments of the present invention
Figure 6E:
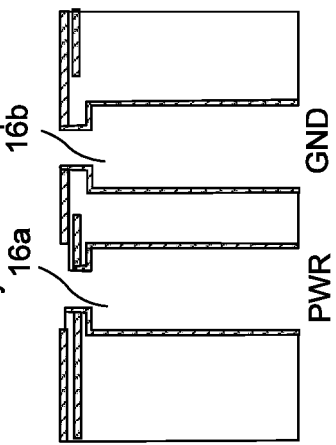
FIG. 6E shows a step of routing in the power planes, in accordance with embodiments of the present invention
Figure 6F:
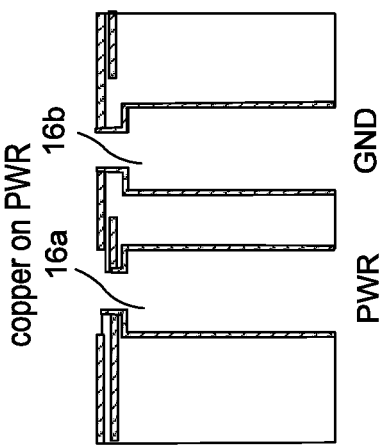
FIG. 6F shows a step of adding the pins, in accordance with embodiments of the present invention.

FIGS. 6A-6G show the methodology steps of the present invention. FIG. 6A describes the etching of the power and/or ground planes at a top surface of a socket. Next a stepped hole is drilled as shown in FIG. 6B. The drilled via 16d is then plated, preferably with a dielectric such as copper 16c, as shown in FIG. 6C to become a plated hole 16a. The holes 16a, 16b have room, with a "hole to copper" tolerances of 2.5 mils to 5 mils to allow for a minimum copper thickness of no smaller than 1.8 mils in between the via 16d and the hole 16a, 16b so that the plated copper area 16ca forms a keep out hole 16c. Next the copper from the top is removed for the power and/or ground planes as shown in FIG. 6D. The power and/or ground plans are then routed as shown in FIG. 6E FIG. 6F shows the step of adding pins in the power or ground planes. The completed structure is shown in FIG. 6G.

Figure 7:
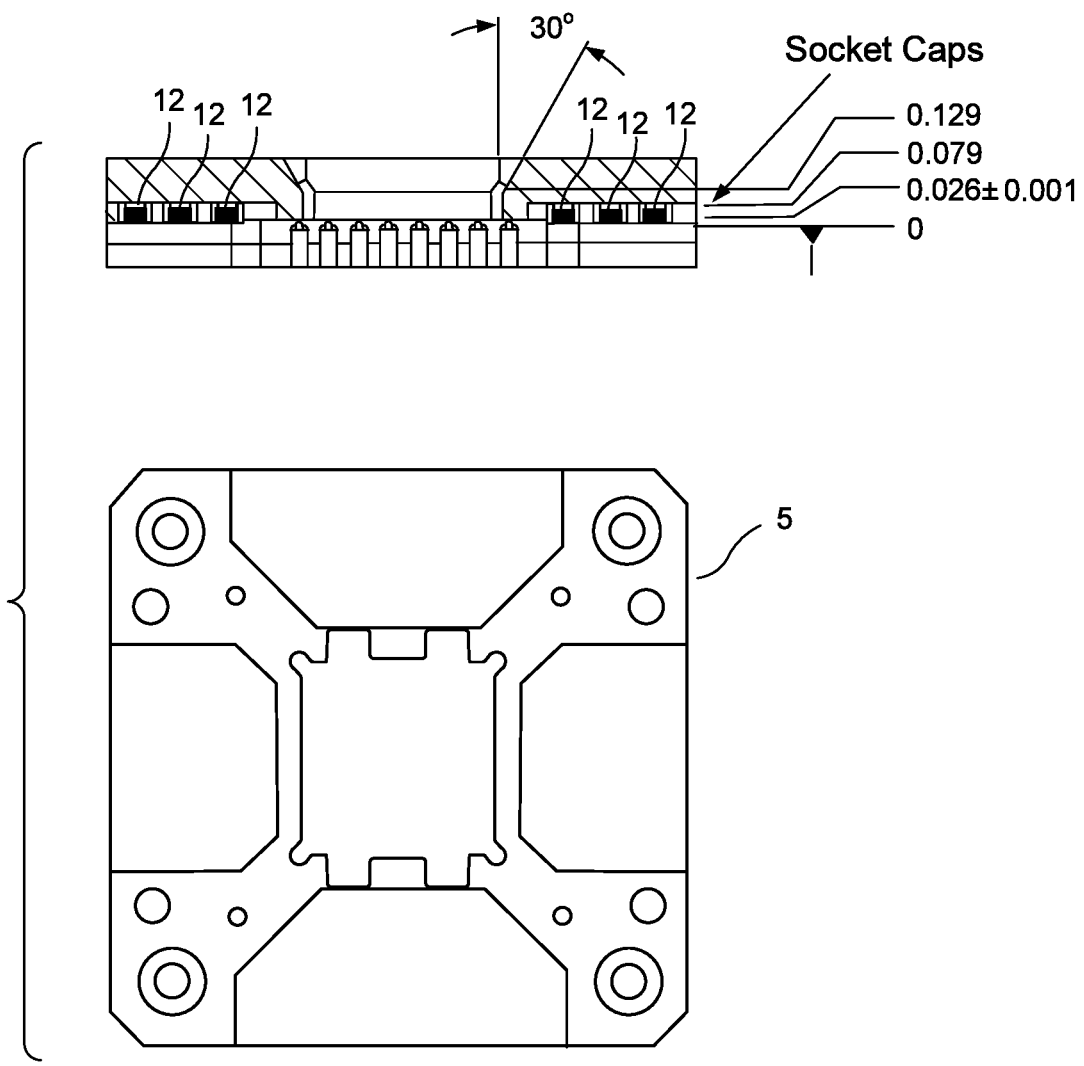
FIG. 7 shows capacitor placement in accordance with the teachings of the present invention.

FIG. 7 shows capacitor placement within the surface of the socket in accordance with the teachings of the present invention. Cutouts under the frame allow for the capacitors to be placed on the surface of the socket. The capacitors are installed using standard PCB assembly process in a panel. The process steps are etching copper or conductive material on PCB, coating or plating copper surface to prevent oxidation and promote adhesion of solder, applying solder-mask to restrict solder flow, applying solder-paste at capacitor pads, pick-and-place capacitors on board, and melting solder-paste in a reflow oven and with typical solder temperature profiles.

This provides for an advantage in applications where it is important that power net ripple is low. Many devices that have challenging PI requirements are integrated circuits (ICs) for use in mobile phones, tablets, and laptops. These devices often have small Ball Grid Array (BGA) pitches of 0.35 mm 0.4 mm and therefore are critical for the mobile market segment. The socket must have an individual contact for each BGA pad so it must also be match the same pitch as the device going into the socket.

Figure 8A:
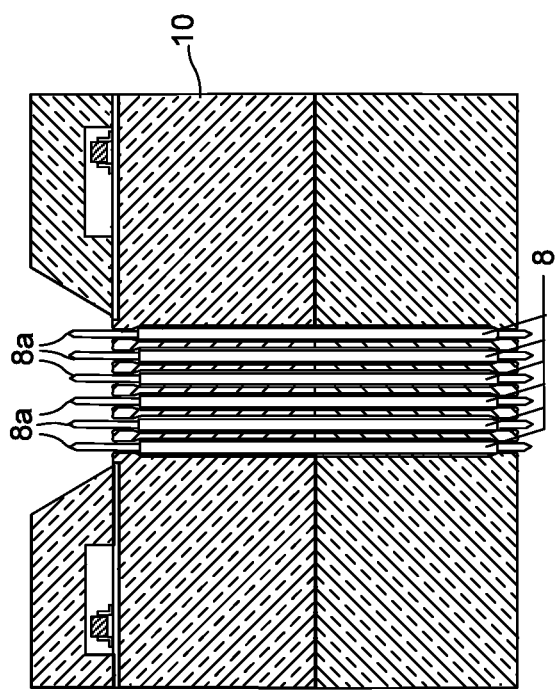
FIG. 8A shows the pins prior to placement in the power or ground planes in the holes or openings, in accordance with embodiments of the present invention.
Figure 8B:
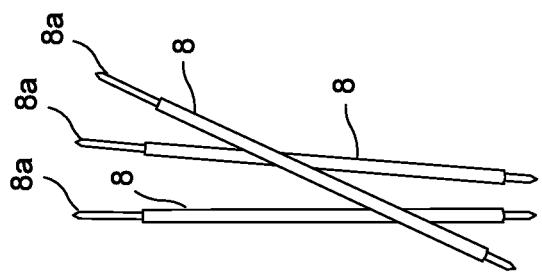
FIG. 8B shows the pins after placement within power or ground planes in holes or openings, in accordance with embodiments of the present invention.
Figure 8B:
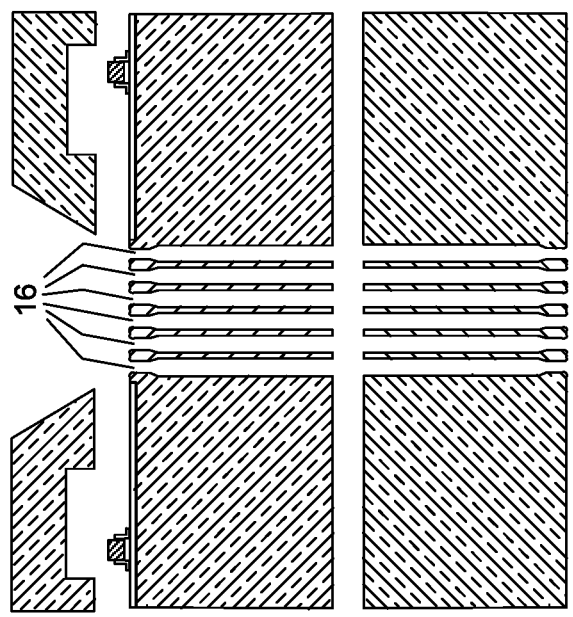

FIG. 8A shows the pins 6 prior to placement in the power or ground planes in the holes or openings. FIG. 8B shows the pins after placement within the power or ground planes in the holes or openings. The holes or vias have room, with a "hole to copper" tolerances of 2.5 mils to 5 mils to allow for a minimum copper thickness of no smaller than 1.8 mils in between the via or opening and the hole so that the plated copper area forms a keep out hole. The hole to copper is the distance between a plated hole 16a or non plated hole 16b and a via 16d and a copper feature on a PCB.

FIG. 9A is a chart of values for different sized holes 16b having a fat or wide portion of dielectric in between the holes 16a. The holes 16a, 16bb accommodate and capture one end of a spring pin. The fat or wide portion of the dielectric 16c accommodates power and ground planes within a range of tolerances for 0.35 mm, 0.4 mm, 0.5 mm, 0.65 mm, 0.8 mm, and 1.0 mm pitch socket hole patterns.

FIG. 9B shows the top view where a copper plane is pulled back and electrically isolated from 3 holes and electrically connected to 1 hole.

FIG. 9C shows a side view of an array of two stepped holes.

Holes 16b have no copper plating whereas holes 16a have copper plating that electrically connects to copper planes. The holes 16b and vias 16a capture the spring pin plunger where a plated hole 16a enables electrical connection of the via to electrically connect to a copper plane. The plating in the holes 16a also enable electrical connection of spring pins to copper planes. Unplated holes 16b capture the spring pins but do not electrically connect to copper planes.

The fat or wide dielectric 16c in between two holes or vias accommodates the copper plane to pass through the array, listed as copper web. Reasonable manufacturing tolerances for the copper web are listed in FIG. 9A, for example.

While presently preferred embodiments have been described for purposes of the disclosure, numerous changes in the arrangement of method steps and apparatus parts can be made by those skilled in the art. Such changes are encompassed within the spirit of the invention as defined by the appended claims.

The above-described embodiments are merely illustrative for the principles of the present disclosure. It is understood that modifications and variations of the arrangements and the details described herein will be apparent to others skilled in the art. It is the intent, therefore, to be limited only by the scope of the pending patent claims and not by the specific details presented by way of description and explanation of the embodiments herein.

What is claimed is:

1. A socket structure comprising:
    a first surface including:
        a first area configured to receive and to couple to a device and comprising a plurality of spring pins; and
        a second area comprising a plurality of capacitors, wherein the first area and the second area do not overlap; and
    a ground plane and a power plane disposed parallel to the first surface and coupled to the capacitors.

2. The socket structure of claim 1, wherein the first area comprises a plurality of plated through holes.

3. The socket structure of claim 2, wherein the plurality of spring pins are positioned in respective ones of the plurality of plated through holes.

4. The socket structure of claim 3, wherein each of the plurality of plated through holes comprises a first portion adjacent the first surface and a second portion including a width greater than a width of the first portion.

5. The socket structure of claim 4, wherein each of the plurality of spring pins includes a body comprising a first end and a second end and a plunger portion that protrudes from the first end and includes a smaller width than a body width of the body.

6. The socket structure of claim 5, wherein a first set of the plated through holes is coupled to the ground plane, and wherein a second set of the plated through holes is coupled to the power plane, wherein the body contacts a respective plated through hole, and wherein the plunger portion extends through a respective first portion of the respective plated through hole and extends through the first surface without contacting the respective plated through hole.

7. The socket structure of claim 1, wherein the plurality of capacitors are configured to reduce a ripple of a power supply.

8. A socket structure comprising:
    a first surface including a first area and a second area comprising a plurality of capacitors, wherein the first area and the second area do not overlap; and
    a ground plane and a power plane disposed parallel to the first surface and coupled to the capacitors, wherein the first area comprises a plurality of plated through holes and a plurality of spring pins each positioned in a respective one of the plurality of plated through holes.

9. The socket structure of claim 8, wherein each of the plurality of plated through holes comprises a first portion adjacent the first surface and a second portion including a width greater than a width of the first portion.

10. The socket structure of claim 9, wherein each of the plurality of spring pins includes a body comprising a first end and a second end and a plunger portion that protrudes from the first end and includes a smaller width than a body width of the body.

11. The socket structure of claim 10, wherein a first set of the plated through holes is coupled to the ground plane, and wherein a second set of the plated through holes is coupled to the power plane, wherein the body contacts a respective plated through hole, and wherein the plunger portion extends through a respective first portion of the respective plated through hole and extends through the first surface without contacting the respective plated through hole.

12. The socket structure of claim 8, wherein the plurality of capacitors are configured to reduce a ripple of a power supply.

13. The socket structure of claim 8, wherein the first area is configured to receive and to couple to a device.

14. The socket structure of claim 13, wherein the device includes a pitch property of one of 0.35 mm or 0.4 mm.

15. A socket structure comprising:
    a top surface;
    an opposite surface located opposite the top surface;
    a ground plane and a power plane disposed parallel to the top surface;
    a plurality of plated through holes extending between the top surface and the opposite surface,
        wherein each of the plurality of plated through holes comprises a first portion adjacent the top surface and a second portion including a width greater than a width of the first portion,
        wherein a first set of the plated through holes is coupled to the ground plane, and
        wherein a second set of the plated through holes is coupled to the power plane; and
    a plurality of spring pins each positioned in a respective one of the plurality of plated through holes,
        wherein each of the plurality of spring pins includes a body comprising a first end and a second end and a plunger portion that protrudes from the first end and includes a smaller width than a body width of the body,
        wherein the body contacts a respective plated through hole, and
        wherein the plunger portion extends through a respective first portion of the respective plated through hole and extends through the top surface without contacting the respective plated through hole.

16. The socket structure of claim 15, further comprising a printed circuit board including the top surface, the ground plane, and the power plane.

17. The socket structure of claim 15, wherein the top surface comprises a first area including the plurality of plated through holes and a second area comprising a plurality of capacitors, wherein the first area and the second area do not overlap.

18. The socket structure of claim 17, wherein the plurality of capacitors are configured to reduce a ripple of a power supply.

19. The socket structure of claim 18, wherein the first area is configured to receive and to couple to a device.

20. The socket structure of claim 19, wherein the device includes a pitch property of one of 0.35 mm or 0.4 mm.

\* \* \* \* \*